(12) United States Patent
Huang et al.

(10) Patent No.: US 11,609,615 B2
(45) Date of Patent: Mar. 21, 2023

(54) PORTABLE ELECTRONIC DEVICE

(71) Applicant: Acer Incorporated, New Taipei (TW)

(72) Inventors: Yi-Ta Huang, New Taipei (TW);
Wu-Chen Lee, New Taipei (TW);
Cheng-Nan Ling, New Taipei (TW);
Wen-Chieh Tai, New Taipei (TW);
Kun-You Chuang, New Taipei (TW)

(73) Assignee: Acer Incorporated, New Taipei (TW)

(*) Notice: Subject to any disclaimer, the term of this patent is extended or adjusted under 35 U.S.C. 154(b) by 248 days.

(21) Appl. No.: 15/931,526

(22) Filed: May 13, 2020

(65) Prior Publication Data

US 2021/0081004 A1 Mar. 18, 2021

(30) Foreign Application Priority Data

Sep. 17, 2019 (TW) .................................. 108133419
Jan. 6, 2020 (TW) .................................. 109100343

(51) Int. Cl.
*G06F 1/16* (2006.01)
*H05K 5/02* (2006.01)
(Continued)

(52) U.S. Cl.
CPC ............ *G06F 1/1681* (2013.01); *E05D 3/12* (2013.01); *E05D 5/10* (2013.01); *E05D 7/00* (2013.01); *G06F 1/1616* (2013.01); *H05K 5/0226* (2013.01); *E05D 2005/106* (2013.01); *E05Y 2900/606* (2013.01)

(58) Field of Classification Search
CPC ....... G06F 1/1681; G06F 1/1616; E05D 3/12; E05D 5/10; E05D 7/00; E05D 2005/106; H05K 5/0226; E05Y 2900/606
See application file for complete search history.

(56) References Cited

U.S. PATENT DOCUMENTS 6,829,140 B2 * 12/2004 Shimano ................. G06F 1/162
345/169
8,339,777 B2 * 12/2012 Ling ..................... H04M 1/022
16/340

(Continued)

FOREIGN PATENT DOCUMENTS

DE 102015109524 7/2016
TW M505786 7/2015
(Continued)

OTHER PUBLICATIONS

"Search Report of Europe Counterpart Application", dated Feb. 2, 2021, p. 1-p. 9.

*Primary Examiner* — Anthony M Haughton
*Assistant Examiner* — Theron S Milliser
(74) *Attorney, Agent, or Firm* — JCIPRNET

(57) ABSTRACT

A portable electronic device including a first body, a second body, a first hinge connected to the first body, a second hinge connected to the second body, and a linking rod is provided. The linking rod has a first end and a second end opposite to each other, wherein the first end is pivoted to the first hinge eccentric to a rotation axis of the first hinge, and the second end is pivoted to the second hinge eccentric to a rotation axis of the second hinge. The first and the second bodies are rotated to be closed to or far away from each other by the first hinge, the second hinge, and the linking rod.

8 Claims, 8 Drawing Sheets

(51) Int. Cl.
  *E05D 3/12* (2006.01)
  *E05D 7/00* (2006.01)
  *E05D 5/10* (2006.01)

(56) References Cited

U.S. PATENT DOCUMENTS

| | | | | |
|---|---|---|---|---|
| 8,484,803 B2* | 7/2013 | Ma | G06F 1/1618 | 16/371 |
| 8,627,546 B2* | 1/2014 | Zhang | G06F 1/1681 | 16/371 |
| 8,938,856 B1* | 1/2015 | Shin | G06F 1/1641 | 16/365 |
| 9,103,147 B1* | 8/2015 | Chuang | G06F 1/1681 | |
| 9,134,767 B2* | 9/2015 | Chen | G06F 1/1681 | |
| 9,317,064 B2* | 4/2016 | Wu | G06F 1/1616 | |
| 9,319,497 B2* | 4/2016 | Sano | H04M 1/0216 | |
| 9,609,095 B2* | 3/2017 | Chuang | G06F 1/1681 | |
| 9,624,704 B1* | 4/2017 | Hsu | E05D 11/087 | |
| 9,683,398 B2* | 6/2017 | Chuang | G06F 1/1681 | |
| 10,174,535 B2* | 1/2019 | Lin | H05K 5/0226 | |
| 10,429,885 B1* | 10/2019 | Shaw | G06F 1/1618 | |
| 10,635,140 B1* | 4/2020 | McKittrick | H05K 5/0226 | |
| 10,642,309 B2* | 5/2020 | Cheng | G06F 1/203 | |
| 2003/0112589 A1* | 6/2003 | Shimano | G06F 1/1643 | 361/679.09 |
| 2011/0255221 A1* | 10/2011 | Ling | G06F 1/1616 | 361/679.01 |
| 2011/0289726 A1* | 12/2011 | Zhang | H04M 1/022 | 16/250 |
| 2012/0047685 A1* | 3/2012 | Ma | H04M 1/022 | 16/354 |
| 2013/0308263 A1* | 11/2013 | Dondurur | G06F 1/166 | 361/679.12 |
| 2014/0130304 A1* | 5/2014 | Dondurur | G06F 1/166 | 16/337 |
| 2014/0130305 A1* | 5/2014 | Dondurur | G06F 1/166 | 16/342 |
| 2014/0133095 A1* | 5/2014 | Wu | G06F 1/1616 | 361/692 |
| 2014/0187296 A1* | 7/2014 | Sano | H04M 1/0216 | 455/575.3 |
| 2014/0293519 A1* | 10/2014 | Wang | G06F 1/1616 | 361/679.01 |
| 2015/0013107 A1* | 1/2015 | Shin | G06F 1/1681 | 16/366 |
| 2015/0040353 A1* | 2/2015 | Chen | G06F 1/1681 | 16/366 |
| 2016/0138310 A1* | 5/2016 | Chuang | E05D 11/1078 | 16/319 |
| 2016/0222707 A1* | 8/2016 | Chuang | G06F 1/1681 | |
| 2017/0138102 A1 | 5/2017 | Chuang | | |
| 2018/0230724 A1* | 8/2018 | Lin | G06F 1/1616 | |
| 2019/0317552 A1* | 10/2019 | Cheng | E05D 11/00 | |
| 2021/0151857 A1* | 5/2021 | Huang | H01Q 1/084 | |

FOREIGN PATENT DOCUMENTS

| | | |
|---|---|---|
| TW | I548332 | 9/2016 |
| TW | M541185 | 5/2017 |

* cited by examiner

PORTABLE ELECTRONIC DEVICE

CROSS-REFERENCE TO RELATED APPLICATION

This application claims the priority benefit of Taiwan application serial no. 108133419, filed on Sep. 17, 2019, and Taiwan application serial no. 109100343, filed on Jan. 6, 2020. The entirety of the above-mentioned patent application is hereby incorporated by reference herein and made a part of this specification.

BACKGROUND

Technical Field

The disclosure relates to a portable electronic device.

Description of Related Art

Portable computing devices, such as palmtop computers, portable computers, notebook computers, and personal digital assistants (PDAs) have become more and more popular. In general, a portable electronic device includes a base and a display assembly configured for the display of the base to comply with user operation and viewing purposes. In particular, as touch display technology advances through time, for portable computers, touch screens have gradually become the basic equipment.

Taking the notebook computer as an example, a hinge between two device bodies is used as a mechanism to cause movement between the bodies; however, once it is equipped with a touch screen, then the hinge must be sufficient to support a force applied on the touch screen by a user while the bodies are unfolded. At the same time, cables connecting between the bodies also need to pass through a hinge structure. Thus, how to enable the hinge structure to have both a support force and a structural strength that comply with user's operating requirements has become a problem faced by relevant designers.

Furthermore, conventional hinge structure often results in a noticeable gap between the screen and the system body of the notebook computer, thereby resulting in poor visual effects. Therefore, how to provide a portable electronic device with support, structural strength and user visual habit compliance is an issue to be solved by the related technical personnel in the art.

SUMMARY

Embodiments of the disclosure provide a portable electronic device, which provides an angle change during rotation and opening of device bodies through an eccentric linking rod between two hinges, so as to compensate for a gap between the device bodies.

A portable electronic device according to an embodiment of the disclosure includes a first body, a second body, a first hinge, a second hinge, and a linking rod. The first hinge is connected to the first body, and the second hinge is connected to the second body. The linking rod has a first end and a second end opposite to each other, and the first end is pivoted to the first hinge and eccentric to a rotation axis of the first hinge. The second end is pivoted to the second hinge and eccentric to a rotation axis of the second hinge. The first body and the second body are rotated to be closed to or far away from each other through the first hinge, the second hinge and the linking rod.

Based on the above, the device bodies of the portable electronic device, in addition to being provided with the dual hinges to serve as a mechanism for rotating to be closed or unfolded with each other, are also connected to the dual hinges via the linking rod, and the two opposite ends of the linking rod and the pivotal connections between the dual hinges are respectively eccentric to the rotation axes of the dual hinges. As such, during the process when the first body and the second body are rotating to be closed or unfolded, structures of the device bodies that are respectively located adjacent to the hinges can change in relative positions due to the configuration of the linking rod, so as to move way or close to each other; and when the device bodies move closer to each other, a fixed spacing between the device bodies that is caused by the dual hinges can be compensated, so that the device bodies can be maintained in a state of abutting against each other when unfolded, thereby allowing a user to experience better visual effects when operating the portable electronic device.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
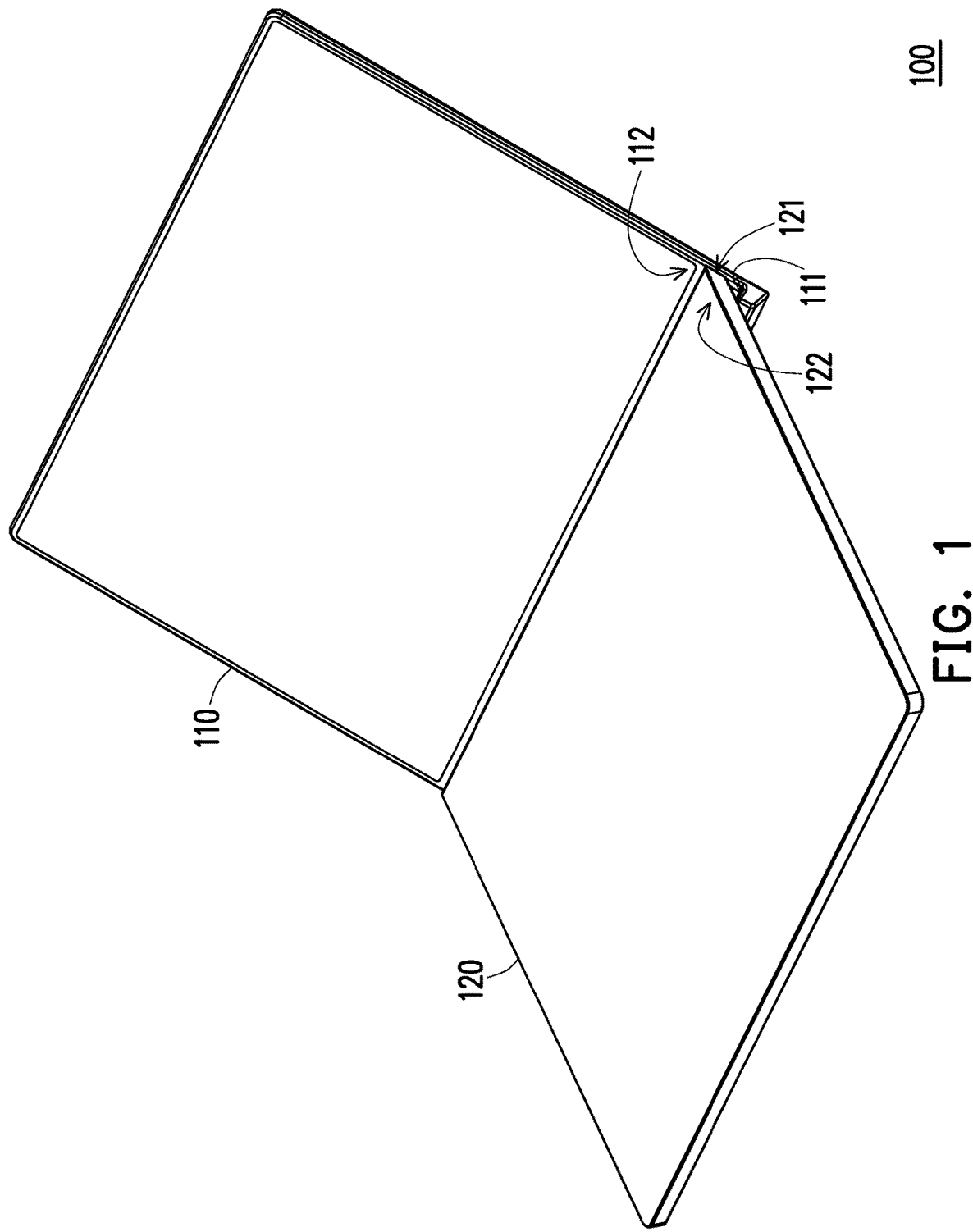
FIG. 1 is a schematic view illustrating a portable electronic device according to an embodiment of the disclosure.

Reference will now be made in detail to the present preferred embodiments of the disclosure, examples of which are illustrated in the accompanying drawings. Wherever possible, the same reference numbers are used in the drawings and the description to refer to the same or like parts.

Figure 2A:
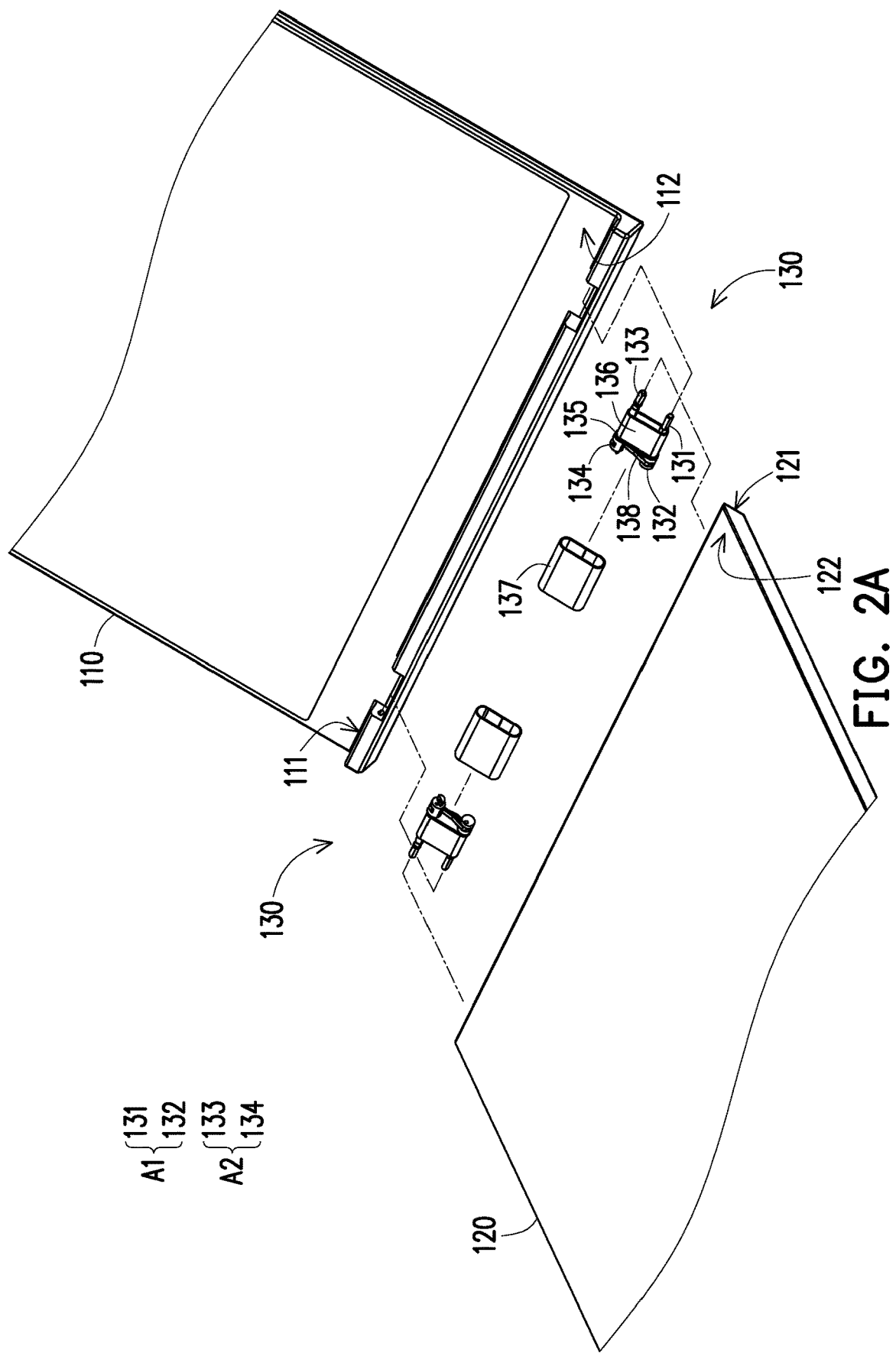
FIG. 2A and FIG. 2B are respective exploded views of the portable electronic device of FIG. 1.
Figure 2B:
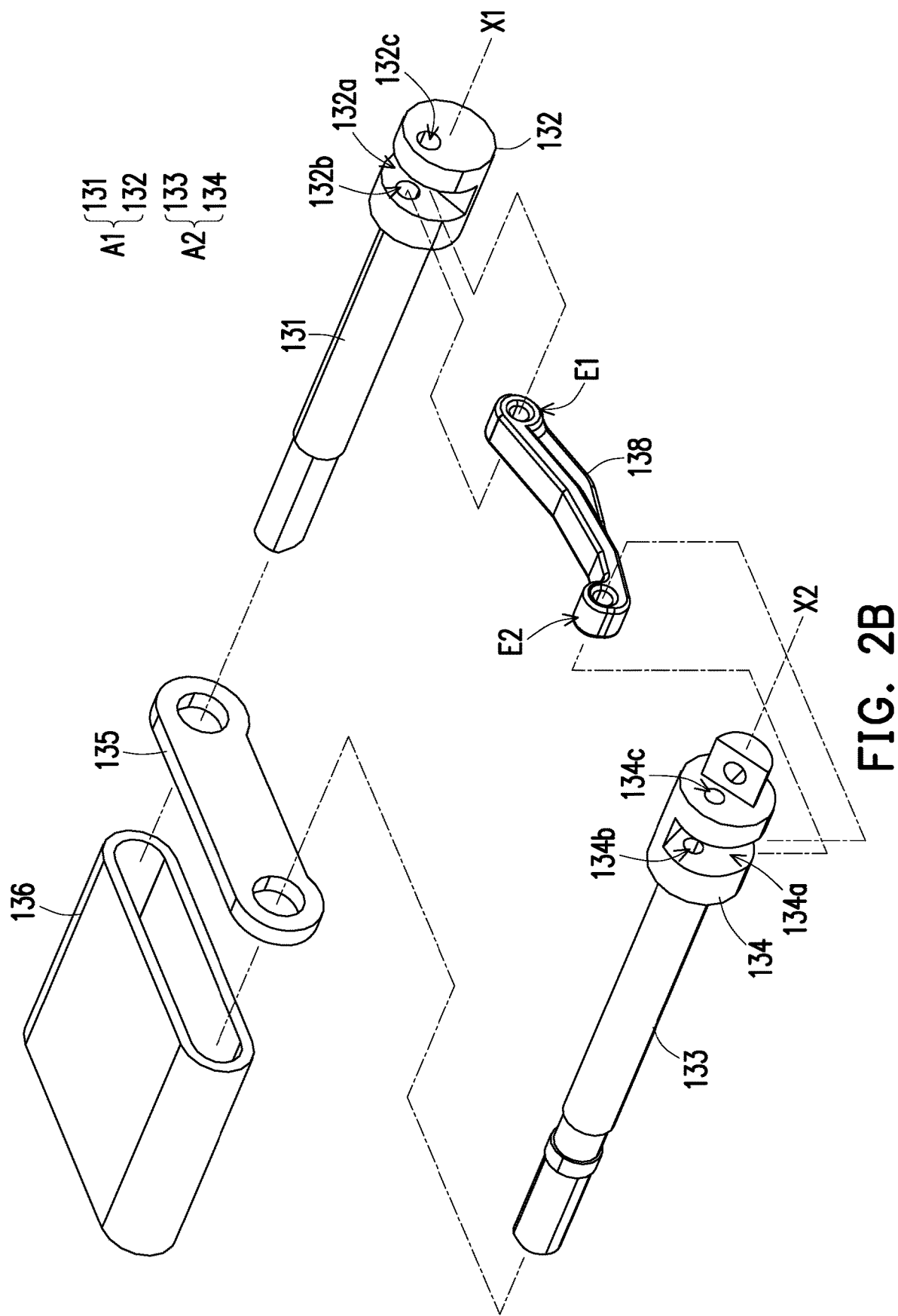

FIG. 1 is a schematic view illustrating a portable electronic device according to an embodiment of the disclosure. FIG. 2A and FIG. 2B are respective exploded views of the portable electronic device of FIG. 1. Referring to FIG. 1, FIG. 2A and FIG. 2B at the same time, in the present embodiment, the portable electronic device 100, such as a notebook computer, includes a first body 110, a second body 120 and a hinge module 130, wherein the hinge module 130 is connected between the first body 110 and the second body 120 so as to enable the first body 110 and the second body 120 can rotate relative to each other to be opened or closed. The hinge module 130 includes a first hinge A1, a second hinge A2 and a linking rod 138. The first hinge A1 is connected to the first body 110, and the second hinge A2 is connected to the second body 120. The linking rod 138 has a first end E1 and a second end E2 opposite to each other, and the first end E1 is pivoted to the first hinge A1 and eccentric to a rotation axis X1 of the first hinge A1. The second end E2 is pivoted to the second hinge A2 and eccentric to a rotation axis X2 of the second hinge A2. The first body 110 and the second body 120 are rotated to be closed to or far away from each other through the first hinge A1, the second hinge A2 and the linking rod 138.

FIG. 2A shows a pair of hinge modules 130 being connected between the first body 110 and the second body 120, and since structural components of the pair of hinge modules 130 are the same, in order to facilitate identification, reference numbers are only provided for the hinge module 130 illustrated on the right. Further speaking, the first hinge A1 has a first hinge portion 131 and a first head portion 132 that are coaxially arranged, and the first hinge portion 131 is connected to the first body 110 so as to be driven by the first body 110. The first head portion 132 has first eccentric holes 132b and 132c, and the first end E1 of the linking rod 138 is pivoted to the first eccentric holes 132b and 132c. In the present embodiment, an outer diameter of the first head portion 132 is greater than an outer diameter of the first hinge portion 131, the first head portion 132 further has a first gap 132a, and the first end E1 of the linking rod 138 is substantially located within the first gap 132a so as to be pivoted between the first eccentric holes 132b and 132c. Similarly, the second hinge A2 has a second hinge portion 133 and a second head portion 134 that are coaxially arranged, the second hinge portion 133 is connected to the second body 120 so as to be driven by the second body 120, the second head portion 134 has second eccentric holes 134b and 134c, and the second end E2 of the linking rod 138 is pivoted to the second eccentric holes 134b and 134c. In the present embodiment, an outer diameter of the second head portion 134 is greater than an outer diameter of the second hinge portion 133, the second head portion 134 further has a second gap 134a, and the second end E2 of the linking rod 138 is located within the second gap 134a so as to be pivoted between the second eccentric holes 134b and 134c.

In addition, the portable electronic device 100 further includes a torque assembly, which is constituted by components 135, 136 and 137, and the first hinge A1 and the second hinge A2 are inserted into the torque assembly in parallel with each other, namely, parallel to the rotation axis X1 and the rotation axis X2.

FIG. 3 to FIG. 6 are partial side views illustrating the portable electronic device in different states. At the same time, rectangular coordinates X-Y-Z are provided to facilitate the descriptions of the components, and the rotation axes X1 and X2 are parallel to the X-axis. Referring first to FIG. 2 B and FIG. 3, in further speaking, an eccentric distance d1 of a pivotal connection between the first end E1 and first hinge A1 with respect to the rotation axis X1 of the first hinge A1 is greater than an eccentric distance d2 of a pivotal connection between the second end E2 and the second hinge A2 with respect to the rotation axis X2 of the second hinge A2. In the present embodiment, the eccentric distance d1 is 1.87 mm, and the eccentric distance d2 is 1.38 mm. In other words, this allows the opposite ends of the linking rod 138 to have different motion strokes, and through the eccentric states, to be prevented from being on a straight line with a linear connection between the first hinge A1 and the second hinge A2, thereby avoiding the first body 110 from felling into a dead point of the linking rod mechanism and become unable to move during the movement.

Figure 6:
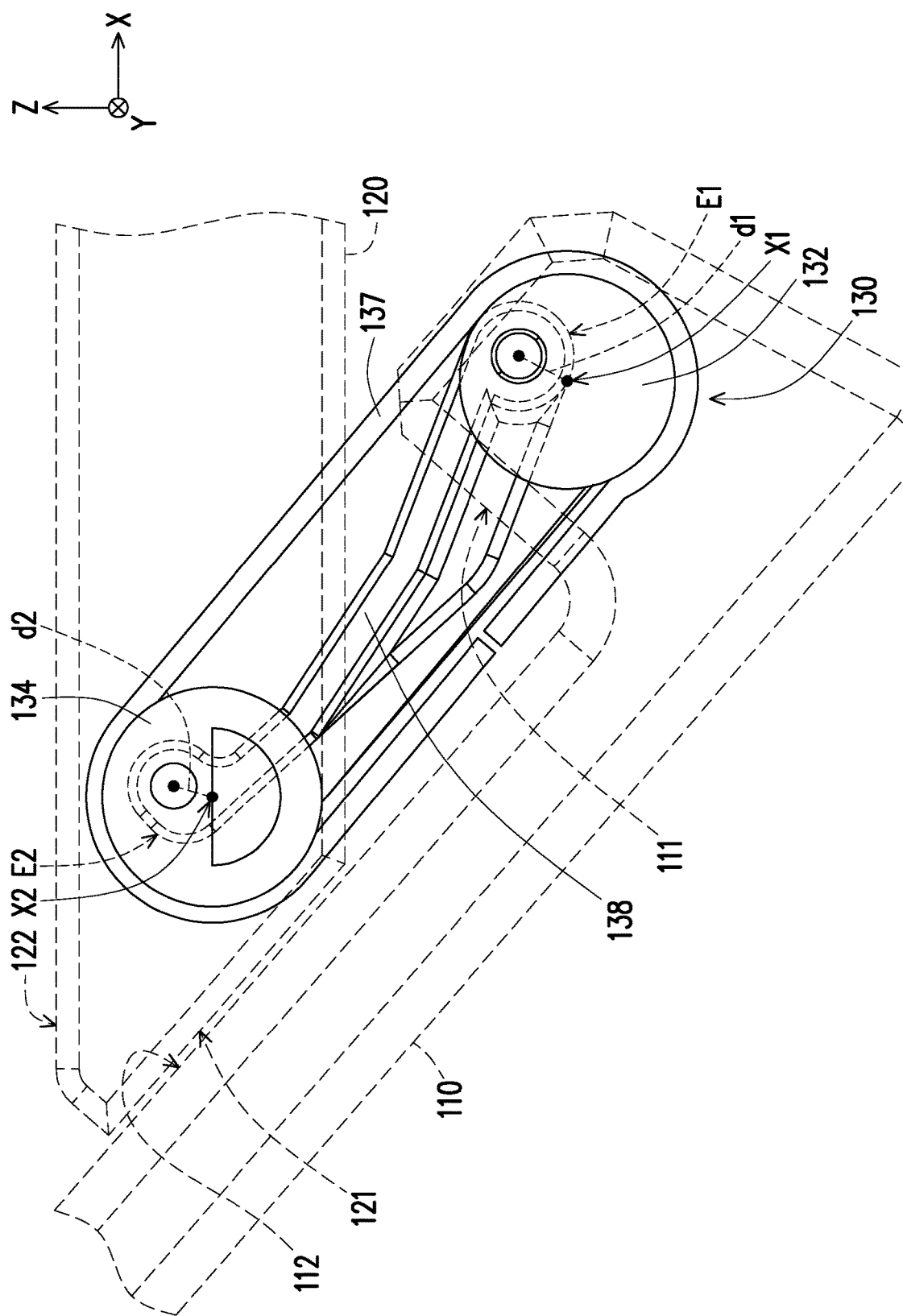
Figure 7:
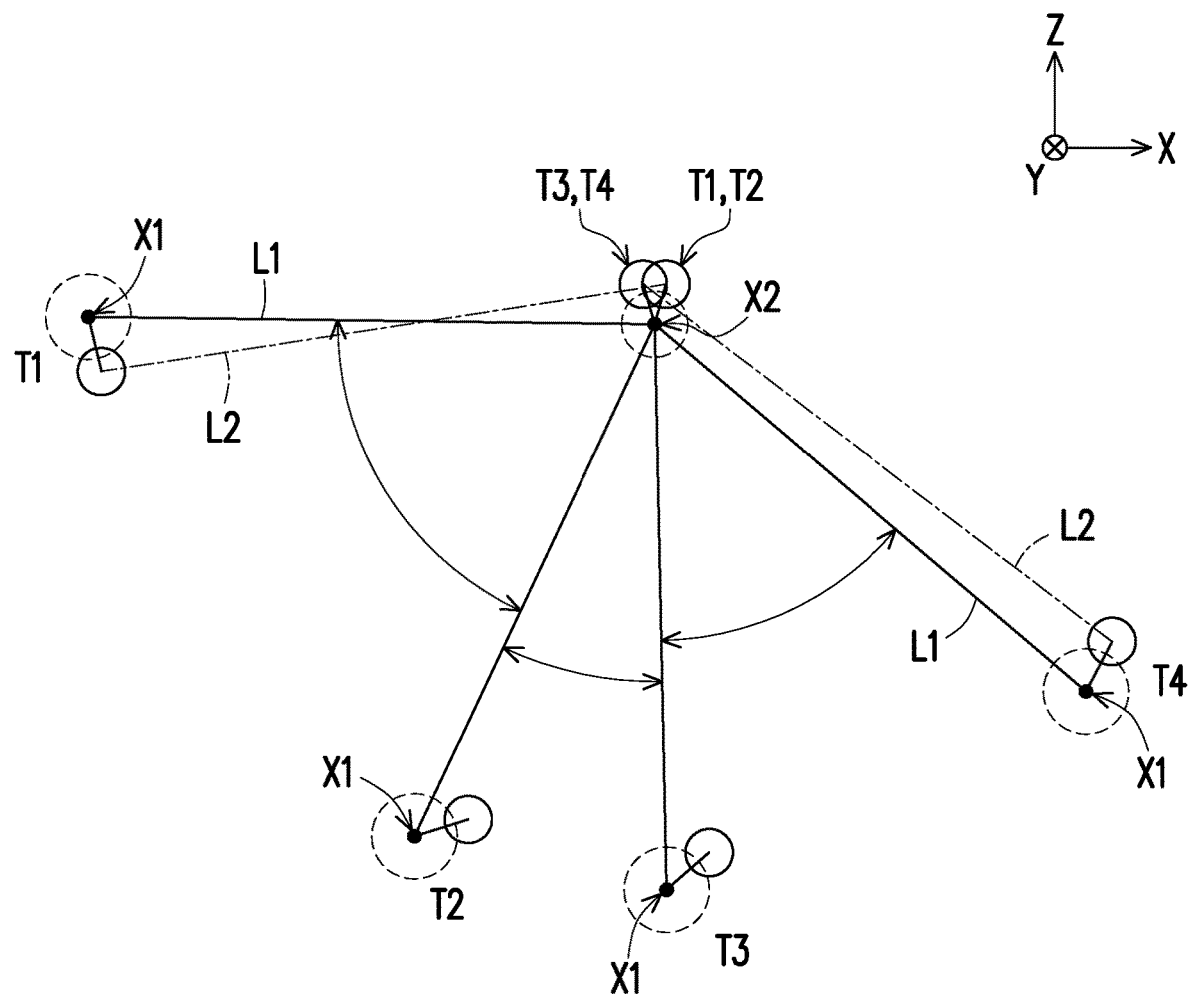
FIG. 7 illustrates a hinge stroke schematic view of the portable electronic device.

FIG. 7 illustrates a hinge stroke schematic view of the portable electronic device, which shows the above related components in a simple schematic manner, wherein dotted circles respectively represent the first hinge A1 and the second hinge A2, and taking the rotation axes X1 and X2 as examples, solid line circles represent the pivotal connections between (the opposite ends of) the linking rod 138 and the respective first hinge A1 and second hinge A2. Next, referring to FIG. 3 through FIG. 6 in sequence and in correspondence with FIG. 7, the first body 110 and the second body 120 are appeared to be gradually unfolded from a closed state shown in FIG. 3 into an unfolded state shown in FIG. 6; it should be noted that FIG. 7 is a stroke schematic diagram illustrating, by using the second body 120 and its second hinge A2 as a reference, that the first hinge A1 and the linking rod 138 are respectively combined with the pivotal connections of the first hinge A1 and the second hinge A2 into a hinge, wherein a first timing T1 shown in FIG. 7 is an example of a state shown in FIG. 3, a second timing T4 shown in FIG. 7 is an example of a state shown in FIG. 4, a third timing T3 shown in FIG. 7 is an example of a state shown in FIG. 5, and a fourth timing T4 shown in FIG. 7 is an example of a state shown in FIG. 6.

In detail, from the process of FIG. 3 to FIG. 6, a period from the first timing T1 to the third timing T3 is defined as a first stage in which the first body 110 and the second body 120 are unfolded relative to each other by rotation; and during this period, the first body 110 and the second body 120 exhibit movement characteristics of moving away from each other. In contrast, a period from third timing T3 to the fourth timing T4 is defined as a second stage in which the first body 110 and the second body 120 are unfolded relative to each other by rotation; and during this period, the first body 110 and the second body 120 exhibit movement characteristics of moving close to each other. As such, the third timing T3 is regarded as a state transition formed between the first stage and the second stage, and it represents an extreme point where the first body 110 and the second body 120 switch from moving away from each other to moving close to each other. In the present embodiment, corresponding to the relationship between the eccentric distances d1 and d2 of the linking rod 138 and the respective first hinge A1 and second hinge A2, an included angle (unfolding angle) of the portable electronic device 100 which is between the first body 110 and the second body 120 at the state transition is substantially 78% to 88% of a maximum unfolding angle between the first body 110 and the second body 120. For example, the maximum unfolding angle of the present embodiment is 140 degrees, and the unfolding angle at the state transition is 115.3 degrees.

Figure 3:
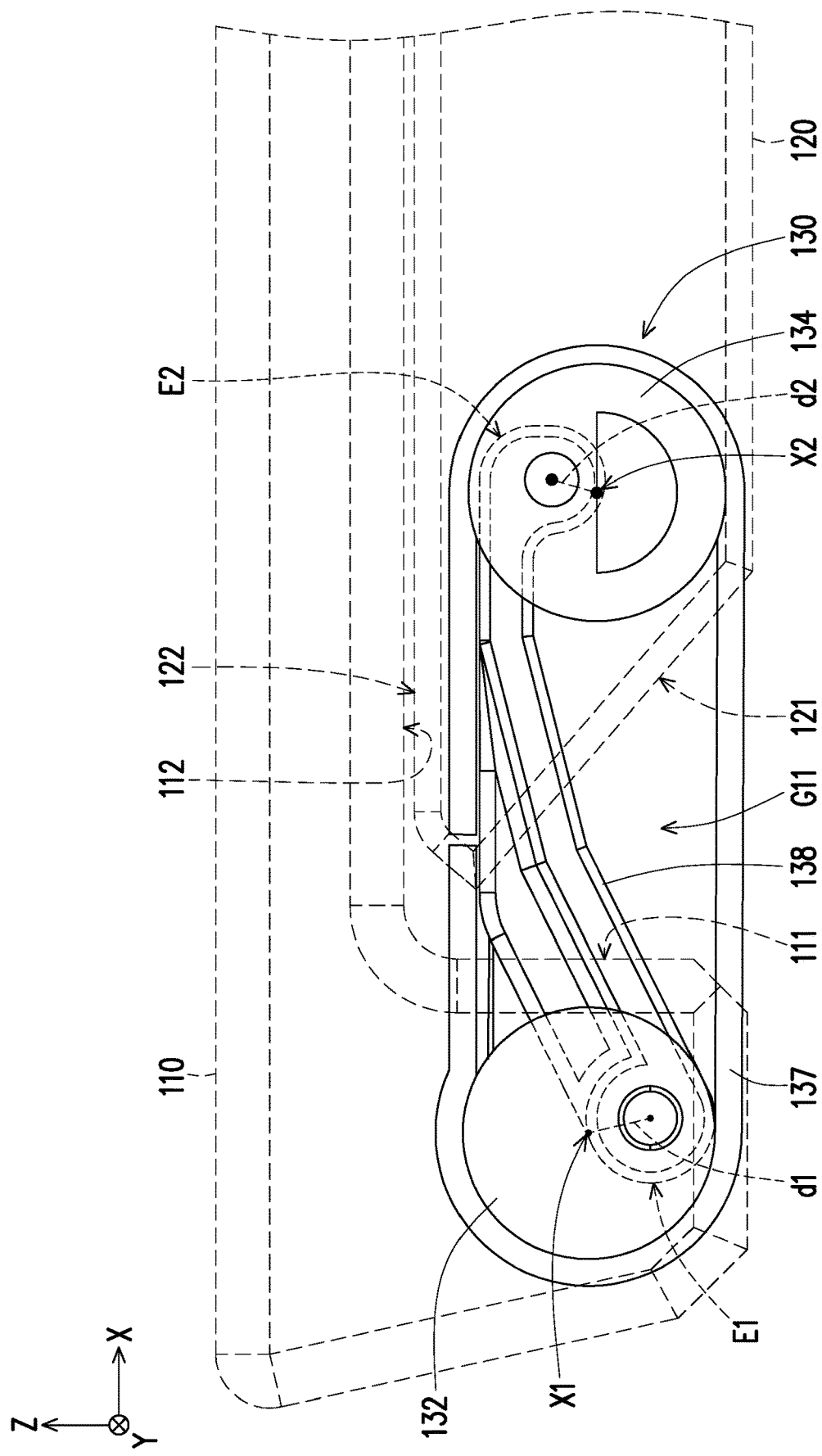
FIG. 3 to FIG. 6 are partial side views illustrating the portable electronic device in different states.
Figure 4:
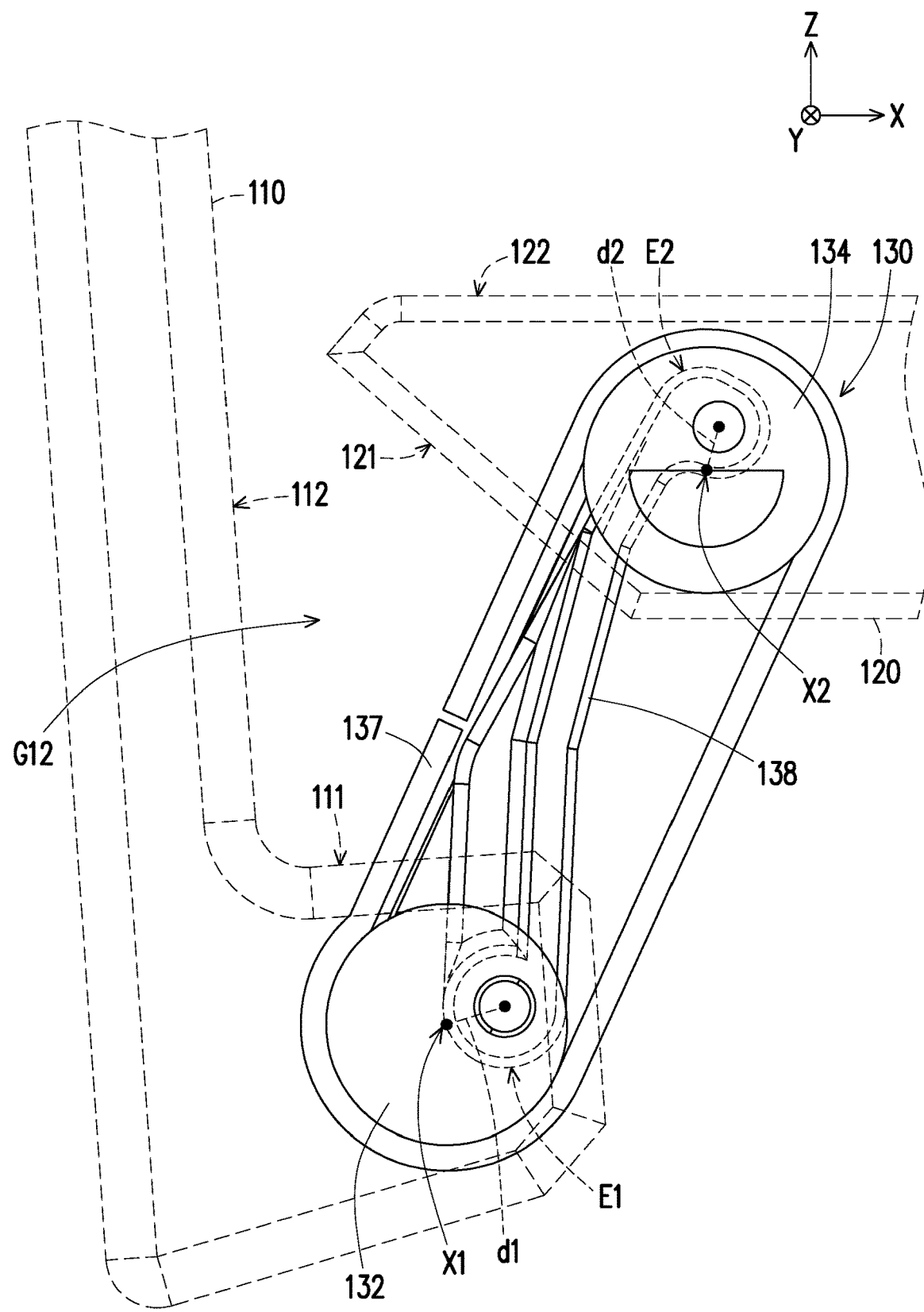
Figure 5:
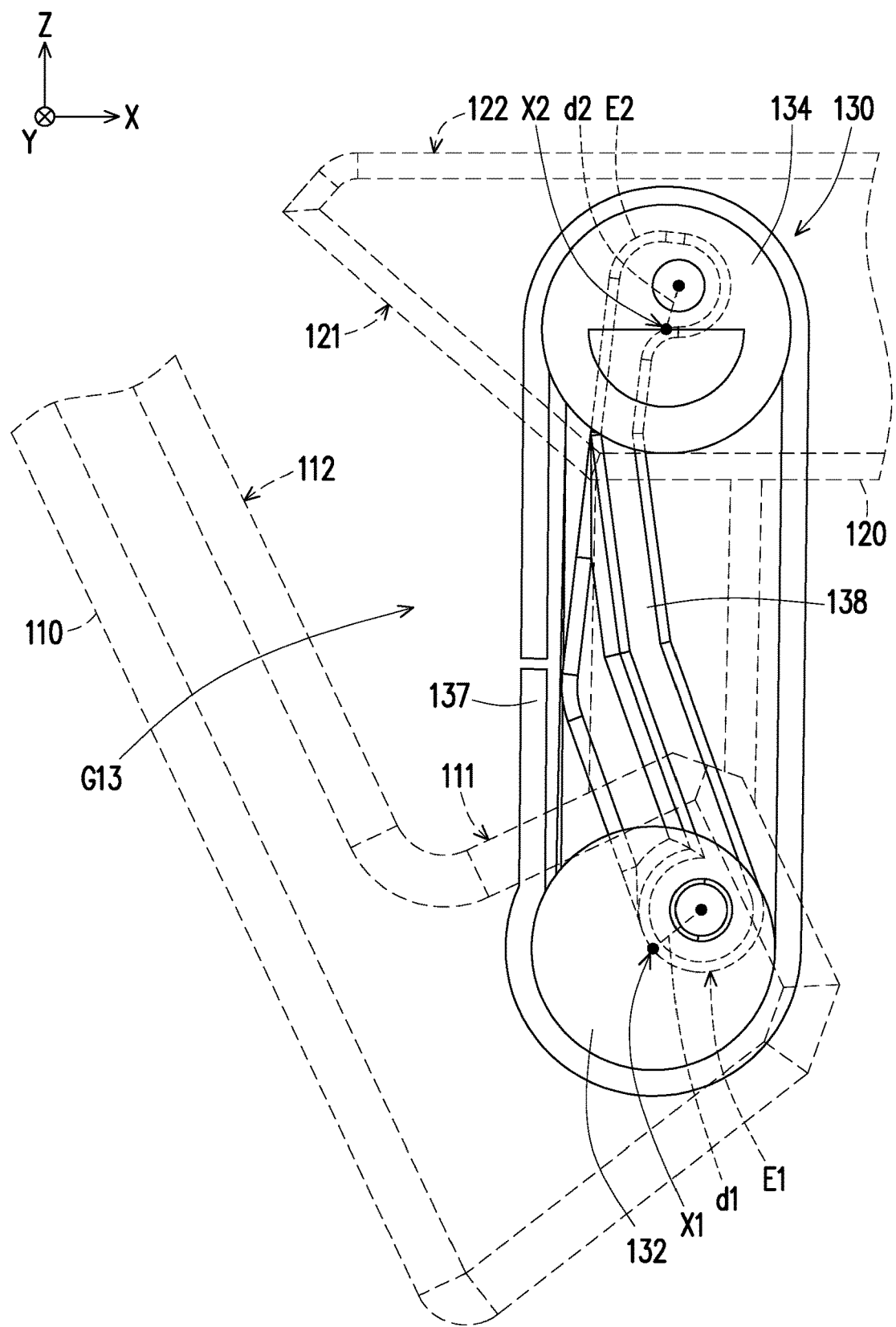

Referring to FIG. 3 to FIG. 6 again, in the present embodiment, the first body 110 has a first surface 111 and a second surface 112 adjacent to the first hinge A1, wherein the second surface 112 is substantially on a same plane with a display surface of the portable electronic device 100; and the second body 120 has a third surface 121 and a fourth surface 122 adjacent to the second hinge A2. In a process of unfolding the first body 110 and the second body 120 from the closed state to the unfolded state, the first surface 111 moves away from the third surface 121 and the second surface 112 moves away from the fourth surface 122.

Furthermore, the first surface 111 is adjacent to the second surface 112 and thus form a (L-shaped) depression, and the third surface 121 is adjacent to the fourth surface 122 and thus form a (wedged-shaped) protrusion. When the first body 110 and the second body 120 are closed with each other, the protrusion is substantially located within the depression, and when the first body 110 and the second body 120 are unfolded relative to each other, the protrusion moves away from the depression, and the depression moves under the second body 120.

In addition, when the first body 110 and the second body 120 are closed, the first surface 111 and the third surface 121 maintain a spacing therebetween, which is a gap G11 shown in FIG. 3; and when the first body 110 and the second body 120 are unfolded, the second surface 112 contacts the third surface 121. In other words, during the unfolding process of switching from FIG. 3 to FIG. 6, through the eccentric configuration of the first hinge A1, the second hinge A2 and the linking rod 138 with respect to the hinge, structures of the first body 110 and the second body 120 at the hinge module 130 can have relative displacements and thus result in an approaching effect, that is, cause the gap G11 between the first body 110 and the second body 120 that is located between the protrusion and the depression shown in FIG. 3 to be expanded along with the unfolding rotations of the device bodies and gradually transform into a gap G12 shown in FIG. 4, a gap G13 shown in FIG. 5 and finally into a state where the third surface 121 is abutted with the second surface 112 of the first body without a space therebetween as shown in FIG. 6. Herein, the gaps G11, G12 and G13 are described by using the third surface 121 of the second body 120 as a reference. In order to make the second surface 112 and the third surface 121 clearly identifiable, two dotted line representing them are separately drawn, but the abutting relationship between the second surface 112 and the third surface 121 is not affected.

Referring to FIG. 7 again, in the present embodiment, an axis (rotation axis X1) of the first hinge A1 and an axis (rotation axis X2) of the second hinge A2 form a first straight line L1 (illustrated with a solid line), the pivotal connection between the first end E1 and the first hinge A1 and the pivotal connection between the second end E2 and the second hinge A2 form a second straight line L2 (illustrated with a dotted chain line). When the first body 110 and the second body 120 are closed, the first straight line L1 and the second straight line L2 are intersected. When the first body 110 and the second body 120 are unfolded (i.e., expanded to the maximum unfolding angle), the first straight line L1 and the second straight line L2 do not intersect. The above are being adopted in the present embodiment to schematically show the eccentric corresponding relationships between the linking rod 138 and the respective first hinge A1 and second hinge A2.

It should be also mentioned that, although the above descriptions only describe the unfolding process of the first body 110 and the second body 120, it is expected that the closing process of the first body 110 and the second body 120 can be known easily by reversing the order of the above steps.

In view of the above, the device bodies of the portable electronic device, in addition to being provided with the dual hinges to serve as the mechanism for rotating to be closed or unfolded with each other, are also connected to the dual hinges via the linking rod, and the two opposite ends of the linking rod and the pivotal connections between the dual hinges are respectively eccentric to the rotation axes of the dual hinges. As such, during the process when the first body and the second body are rotating to be closed or unfolded, the structures of the device bodies that are respectively located adjacent to the hinges can change in relative positions due to the configuration of the linking rod, that is, cause the spaces of the first body and the second body that are nearby each other to be changed, thereby resulting in a corresponding relationship of moving away from or moving closer to each other; and thus, when the device bodies move closer to each other, a fixed spacing between the device bodies that is caused by a fixed distance between the dual hinges can be compensated, so that the device bodies can be maintained in a state of abutting against each other when unfolded, thereby allowing a user to experience better visual effects when operating the portable electronic device.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A portable electronic device, comprising:
   a first body;
   a second body;
   a first hinge, connected to the first body;
   a second hinge, connected to the second body; and
   a linking rod, having a first end and a second end opposite to each other, wherein the first end is pivoted to the first hinge and eccentric to a rotation axis of the first hinge, the second end is pivoted to the second hinge and eccentric to a rotation axis of the second hinge, wherein the first body and the second body are rotated to be closed to or far away from each other through the first hinge, the second hinge and the linking rod, wherein an eccentric distance of a pivoting axis of the first end to the first hinge with respect to the rotation axis of the first hinge is greater than an eccentric distance of a pivoting axis of the second end to the second hinge with respect to the rotation axis of the second hinge,
   wherein the first body has a first surface and a second surface adjacent to the first hinge, the second body has a third surface and a fourth surface adjacent to the second hinge, and in a process of unfolding the first body and the second body from a closed state to an unfolded state, the first surface moves away from the third surface and the second surface moves away from the fourth surface,
   wherein the first surface is adjacent to the second surface and thus form a depression, the third surface is adjacent to the fourth surface and thus form a protrusion, wherein when the first body and the second body are closed with each other, the protrusion is located within the depression, and when the first body and the second body are unfolded relative to each other, the protrusion moves away from the depression, and the depression moves under the second body,
   wherein when the first body and the second body are closed, a spacing is kept between the first surface and the third surface, and when the first body and the second body are unfolded, the second surface contacts the third surface,
   wherein the rotation axis of the second hinge is located in a fixed position and does not move in the second body during the process of folding and during the process of unfolding.

2. The portable electronic device as recited in claim 1, wherein the first hinge has a first hinge portion and a first head portion coaxially arranged with each other, the first hinge portion is connected to the first body so as to be driven by the first body, the first head portion has at least one first eccentric hole, and the first end of the linking rod is pivoted to the first eccentric hole.

3. The portable electronic device as recited in claim 2, wherein an outer diameter of the first head portion is greater than an outer diameter of the first hinge portion, the first head portion further has a first gap, and the first end of the linking rod within the first gap.

4. The portable electronic device as recited in claim 1, wherein the second hinge has a second hinge portion and a second head portion coaxially arranged with each other, the second hinge portion is connected to the second body to be driven by the second body, the second head portion has at least one second eccentric hole, and the second end of the linking rod is pivoted to the second eccentric hole.

5. The portable electronic device as recited in claim 4, wherein an outer diameter of the second head portion is greater than an outer diameter of the second hinge portion, the second head portion further has a second gap, and the second end of the linking rod is located within the second gap.

6. The portable electronic device as recited in claim 1, further includes a torque assembly, and the first hinge and the second hinge are inserted into the torque assembly in parallel with each other.

7. The portable electronic device as recited in claim 1, wherein in a first stage in which the first body and the second body are unfolded relative to each other, the first body moves away from the second body, and in a second stage in which the first body and the second body are unfolded relative to each other, the first body moves close to the second body, and a state transition is formed between the first stage and the second stage, wherein an included angle between the first body and the second body at the state transition is 78% to 88% of a maximum unfolding angle between the first body and the second body.

8. The portable electronic device as recited in claim 1, wherein an axis of the first hinge and an axis of the second hinge form a first straight line, a pivotal connection between the first end and the first hinge and a pivotal connection between the second end and the second hinge form a second straight line, wherein when the first body and the second body are closed, the first straight line and the second straight line are intersected, and when the first body and the second body are unfolded, the first straight line and the second straight line do not intersect.

\* \* \* \* \*